United States Patent
Schluter et al.

(10) Patent No.: US 9,131,622 B2
(45) Date of Patent: Sep. 8, 2015

(54) RACK RAIL LOCKING LEVER

(75) Inventors: Robert Schluter, Kinnelon, NJ (US); Nico Corbo, Stroudsburg, PA (US); Mohammed Gebril, Boonton, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 591 days.

(21) Appl. No.: 13/403,510

(22) Filed: Feb. 23, 2012

(65) Prior Publication Data

US 2012/0305511 A1 Dec. 6, 2012

Related U.S. Application Data (60) Provisional application No. 61/493,040, filed on Jun. 3, 2011.

(51) Int. Cl.
- A47B 96/00 (2006.01)
- H05K 7/14 (2006.01)
- A47B 57/40 (2006.01)

(52) U.S. Cl.
CPC ............... *H05K 7/1489* (2013.01); *A47B 57/40* (2013.01); *Y10T 403/595* (2015.01)

(58) Field of Classification Search
CPC ...... A47B 57/32; A47B 57/40; A47B 57/402; A47B 57/404; A47B 57/48; A47B 57/482; A47B 57/485; A47B 57/487; H05K 7/1489; Y10T 403/595
USPC .......... 211/183, 187, 192, 193, 207; 248/235, 248/241, 243–245, 222.51, 222.52
See application file for complete search history.

(56) References Cited

U.S. PATENT DOCUMENTS

| | | | |
|---|---|---|---|
| 3,411,459 A * | 11/1968 | Hyatt | 410/147 |
| 4,106,738 A * | 8/1978 | Kostecky | 248/235 |
| 5,063,715 A * | 11/1991 | Goodman | 52/36.6 |
| 5,580,138 A * | 12/1996 | Grabher | 312/319.1 |
| 5,730,514 A * | 3/1998 | Hashemi | 312/333 |
| 6,079,173 A * | 6/2000 | Waalkes et al. | 52/239 |
| 6,422,399 B1 * | 7/2002 | Castillo et al. | 211/26 |
| 6,749,275 B2 * | 6/2004 | Cutler et al. | 312/334.4 |
| 6,871,920 B2 * | 3/2005 | Greenwald et al. | 312/334.4 |
| 2003/0111436 A1 | 6/2003 | Basinger et al. | |
| 2004/0089779 A1 * | 5/2004 | Greenwald et al. | 248/241 |
| 2004/0094492 A1 * | 5/2004 | Greenwald et al. | 211/26 |
| 2004/0104184 A1 * | 6/2004 | Hartman et al. | 211/26 |
| 2008/0073469 A1 | 3/2008 | Mushan et al. | |

OTHER PUBLICATIONS

European Search Report, Dec. 12, 2012, EPO, 4 pages.

* cited by examiner

*Primary Examiner* — Korie H Chan
(74) *Attorney, Agent, or Firm* — Drinker Biddle & Reath LLP (57) ABSTRACT

A locking lever for a removable rack rail includes a base plate, a body plate mounted to the base plate so as to be pivotable about a pivot point between a first position and a second position with respect to the base plate, a tang extending in a lateral direction from the body plate, and a finger tab extending from the body plate for actuating the body plate to pivot about the pivot point with respect to the base plate, wherein when the body plate is in the second position the tang is at least partially recessed so that an end portion of the locking lever can fit in a slot on a mounting rail, and wherein when the body plate is in the first position the tang extends laterally beyond the lateral edge of the base plate so that the end portion cannot be removed from the slot.

19 Claims, 10 Drawing Sheets

RACK RAIL LOCKING LEVER

CROSS-REFERENCE TO RELATED APPLICATIONS

This application claims the priority of U.S. Provisional Application No. 61/493,040 filed on Jun. 3, 2011, which is incorporated herein by reference herein in its entirety.

FIELD OF THE INVENTION

The invention relates, to a rack assembly for mounting electronic components, and in particular to rack rail locking lever system for removably securing rack rails into a rack assembly.

BACKGROUND

A rack assembly is commonly used for mounting electronic components such as computer, audio, and video equipment. Typically, a rack assembly is an open framework including vertical mounting rails connected by top and bottom generally rectangular frames. To enable the rack assembly to accommodate various size components at desired locations, rack rails may extend across the rack assembly from one mounting rail to another. In conventional commercially available systems, the rack rails are generally bolted or otherwise fastening to the mounting rails, which requires the use of tools. Alternatively, the rack rails may include a static hook shape at each end so that the rack rails are held in slots in the mounting rails by the force of gravity acting on the rack rails themselves as well as on components supported by the rack rails. But the use of mechanical fasteners such as bolts can be cumbersome and time consuming, and relying on gravity alone risks that a rack rail can be dislodged inadvertently.

Therefore, it would be desirable to have a rack rail latching mechanism to easily and removably secure a rack rail to a rack assembly mounting rail that does not require the use of tools or separate fasteners, but still offers more security than mere reliance on gravity.

SUMMARY

An embodiment of a locking lever for a removable rack rail is provided including a base plate and a body plate. The base plate is adapted to be affixed to or incorporated into a rack rail and has a longitudinal direction substantially parallel to the rack rail and a lateral direction perpendicular to the longitudinal direction. The body plate is pivotably mounted to the base plate so as to be pivotable about a pivot point between a first position and a second position with respect to the base plate. The body plate has a longitudinal direction that is parallel to the longitudinal direction of the base plate when the body plate is in the first position and a lateral direction perpendicular to the longitudinal direction. The tang extending in a lateral direction from the body plate, and the finger tab extends from the body plate for actuating the body plate to pivot about the pivot point with respect to the base plate. When the body plate is in the second position with respect to the base plate, the tang is at least partially recessed in the lateral direction with respect to the base plate so that an end portion of the rack rail locking lever has a size in the lateral direction at least slightly smaller than the size of a slot on a mounting rail on the rack, to enable insertion of the end portion into the slot. When the body plate is in the first position with respect to the base plate, the tang extends laterally beyond the base plate so that the end portion of the rail locking lever has a size in the lateral direction at least slightly larger than the size of the slot on the mounting rail, to prevent removal of the end portion from the slot.

Another embodiment of a locking lever includes a base plate, a body plate, a tang, and a finger tab. The base plate is adapted to be affixed to or incorporated into a rack rail and has a longitudinal direction substantially parallel to the rack rail and a lateral direction perpendicular to the longitudinal direction, the base plate including a feature to limit the distance of insertion of the base plate into a slot on a mounting rail of a rack. The body plate is mounted to the base plate so as to be pivotable about a pivot point between a first position and a second position with respect to the base plate, and has a longitudinal direction that is parallel to the longitudinal direction of the base plate when the body plate is in the first position and a lateral direction perpendicular to the longitudinal direction. The tang extends in a lateral direction from the body plate, and the finger tab extends from the body plate for actuating the body plate to pivot about the pivot point with respect to the base plate, the tang and the finger tab being located on opposite sides of the pivot point. When the body plate is in the second position with respect to the base plate, the tang is at least partially recessed in the lateral direction with respect to the base plate so that an end portion of the locking lever has a size in the lateral direction at least slightly smaller than the size of a slot on a mounting rail on the rack, to enable insertion of the end portion into the slot. When the body plate is in the first position with respect to the base plate, the tang extends laterally beyond the base plate so that the end portion of the rail locking lever has a size in the lateral direction at least slightly larger than the size of the slot on the mounting rail, to prevent removal of the end portion from the slot. The body plate includes a raised dimple on a face adjacent to the base plate and the base plate further includes a detent on a face adjacent to the body plate, such that when the body plate is in the first position, the dimple is engaged with the detent to inhibit movement of the body plate out of the first position.

Another embodiment of a locking lever includes a base plate, a body plate, a tang, a spring, and a finger tab. The base plate is adapted to be affixed to or incorporated into a rack rail, the base plate having a longitudinal direction substantially parallel to the rack rail and a lateral direction perpendicular to the longitudinal direction, and includes a feature to limit the distance of insertion of the base plate into a slot on a mounting rail of a rack. The body plate is mounted to the base plate so as to be pivotable about a pivot point between a first position and a second position with respect to the base plate, and has a longitudinal direction that is parallel to the longitudinal direction of the base plate when the body plate is in the first position and a lateral direction perpendicular to the longitudinal direction. The tang extends in a lateral direction from the body plate, the spring biases the body plate toward the first position with respect to the base plate when the body plate is in the second position, and the finger tab extends from the body plate for actuating the body plate to pivot about the pivot point with respect to the base plate, the tang and the finger tab being located on the same side of the pivot point. When the body plate is in the second position with respect to the base plate, the tang is at least partially recessed in the lateral direction with respect to a lateral edge of the base plate so that an end portion of the locking lever has a size in the lateral direction at least slightly smaller than the size of the slot on the mounting rail, to enable insertion of the end portion into the slot. When the body plate is in the first position with respect to the base plate, the tang extends laterally beyond the base plate so that the end portion of the rail locking lever has a size in the lateral direction at least slightly larger than the size of the slot on the mounting rail, to prevent removal of the end portion from the slot. The tang includes a sloped front surface such that when the end portion of the locking lever is inserted into the slot on the mounting rail, the sloped front surface of the tang is adapted to contact the mounting rail adjacent to the slot, thereby causing the body plate to pivot to the second position with respect to the base plate and allowing the end portion of the locking lever to be inserted into the slot.

Another embodiment of a locking lever includes a base plate, a body plate, a tang, a spring, and a finger tab. The base plate is adapted to be affixed to or incorporated into a rack rail. The body plate is mounted to the base plate so as to be pivotable about a pivot point between a first position and a second position with respect to the base plate, and the tang protrudes from the body plate. The spring biases the body plate toward the first position with respect to the base plate when the body plate is in the second position. The finger tab extends from the body plate for actuating the body plate to pivot about the pivot point with respect to the base plate. The tang and the finger tab are located on the same side of the pivot point. When the body plate is in the second position with respect to the base plate, the tang is at least partially recessed with respect to the base plate so that an end portion of the locking lever has a size at least slightly smaller than the size of the slot on the mounting rail, to enable insertion of the end portion into the slot. When the body plate is in the first position with respect to the base plate, the tang extends beyond the base plate so that the end portion of the rail locking lever has a size at least slightly larger than the size of the slot on the mounting rail, to prevent removal of the end portion from the slot. The tang includes a sloped front surface such that when the end portion of the locking lever is inserted into the slot on the mounting rail, the sloped front surface of the tang is adapted to contact the mounting rail adjacent to the slot, thereby causing the body plate to pivot to the second position with respect to the base plate and allowing the end portion of the locking lever to be inserted into the slot.

BRIEF DESCRIPTION OF DRAWINGS

For the purpose of illustrating the invention, there are shown in the drawings embodiments that are presently preferred; it being understood, however, that this invention is not limited to the precise arrangements and constructions particularly shown.

FIGS. 4A-4D are side views showing a sequence of installing a rack rail as in FIG. 1 into mounting rails of a rack assembly.

DETAILED DESCRIPTION

Figure 1:
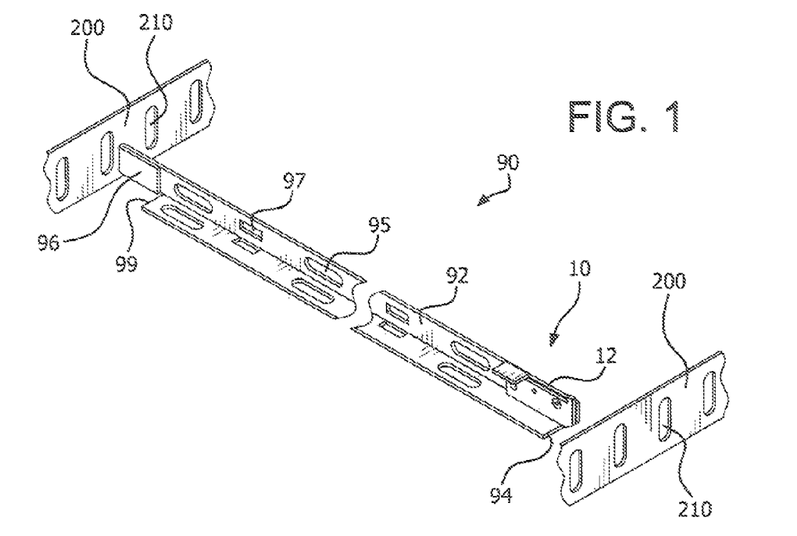
FIG. 1 is a perspective view showing one type of rack rail including an embodiment of a rack rail locking lever at one end and an end insert at the other end.

An embodiment of a rack rail 90 is shown in FIG. 1. The rack rail 90 includes a side rail member 92 and a bottom rail member 94 formed together in an angled or L-shaped cross-section. One or both of the side rail member 92 and the bottom rail member 94 may include slots 95, 97 that can be used to mount various components on the rack rail 90.

An end insert 96 is formed at one end of the rack rail 90, such as by doubling an end portion of the side rail member 92 over on itself, but it may simply be an extension of or attached to the side rail member. A corresponding end portion of the bottom rail member 94 is cut away or absent, so that the end insert 96 extends beyond the bottom rail member 94. The end insert 96 has a thickness and a lateral dimension that are both smaller than the corresponding dimensions of a slot 210 in a mounting rail 200 of a rack assembly, to allow insertion of the end insert 96 into the slot 210. The end insert 96 can be inserted into the slot 210 until an end wall 99 of the bottom rail member 94 contacts the mounting rail 200, thus limiting the travel of the rack rail 90 toward the mounting rail 200.

Figure 2:
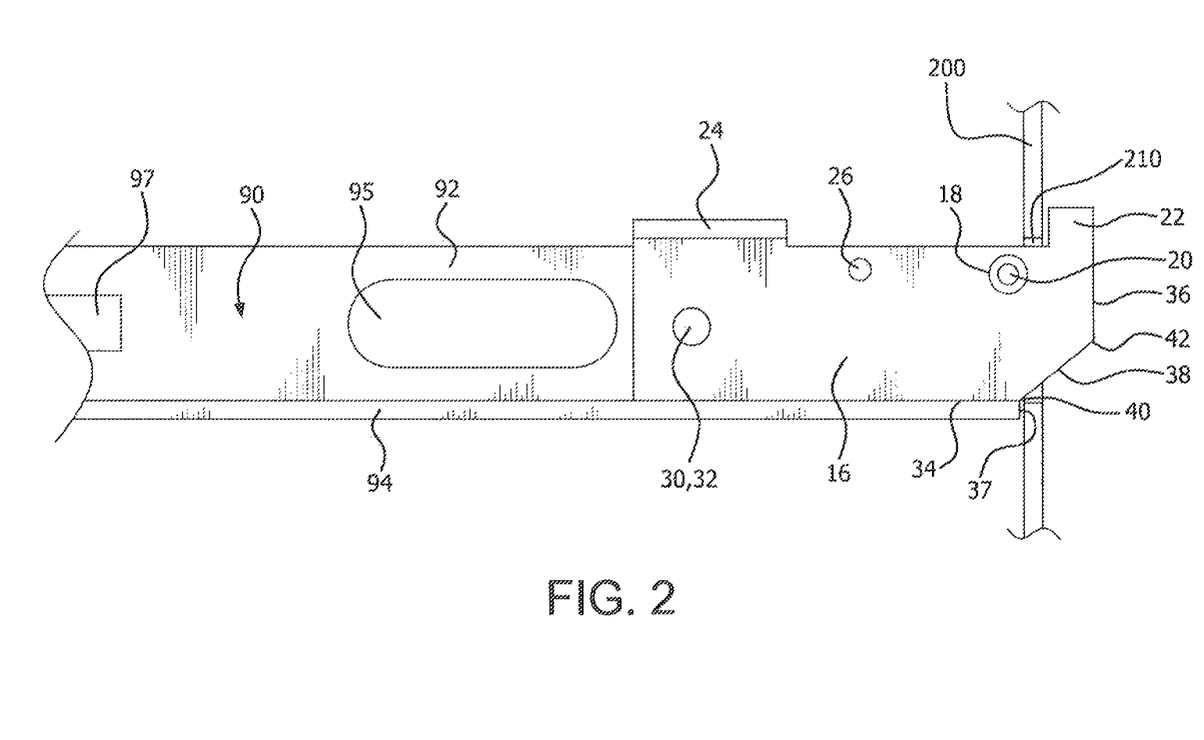
FIG. 2 is a side view showing in detail a rack rail locking lever at the one end of a rack rail as in FIG. 1.

A rack rail locking lever 10 is positioned at an opposite end of the rack rail 90, in one embodiment shown in detail in FIG. 2. The locking lever 10 includes a base plate 12, which may be formed integrally with the side rail member 92 of the rack rail 90, or may be rigidly affixed to an end of the side rail member 92. The locking lever 10 further includes a body plate 16 that is pivotably mounted with respect to the base plate 12. In the depicted embodiment, the body plate 16 is connected to the base plate 12 by a pivot pin or rivet 20 that is secured through an aperture 18 in the body plate 16.

For ease of description, the base plate 12 of the rack rail 90 is understood to have a thickness, a longitudinal direction which extends parallel to the length of the rack rail 90, and a lateral direction which extends perpendicularly to the thickness and the longitudinal direction. Similarly, the body plate 16 has a thickness, a longitudinal direction, and a lateral direction.

In the locking lever 10, an end portion of the base plate 12 extends outwardly in a longitudinal direction beyond an end wall 37 of the bottom rail member 94, and the longitudinally outer ends 70, 72 of the base plate 12 and the body plate 16, respectively, may be substantially aligned.

The body plate 16 includes a tang 22 that extends laterally outward in one direction at or near the longitudinal end 70 of the body plate 16, and at a distance from the pivot pin 20. The body plate 16 is pivotable about the pivot pin 20 with respect to the base plate 12 between a first position and a second position.

In the first position, which corresponds to the locked position, the longitudinal direction of the body plate 16 is substantially parallel to the longitudinal direction of the base plate 12 (i.e., the body plate 16 lies substantially on top of the base plate 12). In the first position, the combined lateral dimension of the locking lever 10, including the base plate 12 and the body plate 16 with the tang 22, is at least slightly larger than the height of a slot 210 in a mounting rail 200. That is, the end portion of the body plate 16 including the tang 22 has a lateral (vertical in the illustrated embodiment) dimension that is larger than the slot 210. In the depicted embodiment, the body plate 16 may contact the bottom rail member 94 in the first position.

In the second position, which corresponds to the unlocked position, the longitudinal direction of the body plate 16 is pivoted to be at an angle with respect to the longitudinal direction of the base plate 12, which results in the tang 22 being at least partially retracted in the lateral direction with respect to the base plate 12. Therefore, in the second position, the combined lateral dimension of the locking lever 10, including the base plate 12 and the body plate 16 with the tang 22, is at least slightly smaller than the height of the slot 210. That is, the body plate 16 is pivoted about the pivot, thereby rotating the tang 22.

To facilitate pivoting of the body plate 16 with respect to the base plate 12 between the first and second positions the body plate 16 may include a finger tab 24, as shown in FIGS. 1 and 2. In the depicted embodiment, the finger tab 24 is formed from the same piece of material as the body plate 16 and is bent over at approximately a right angle so as to extend in a direction away from the base plate 12. The finger tab 24 is located on an opposite portion of the body plate 16 from the tang 22 with respect to the pivot pin 20, such that when the finger tab 24 is moved laterally outward with respect to the base plate 12 (upward in the illustrated embodiment), the tang 22 pivots so as to be at least partially recessed in a lateral direction with respect to the base plate 12, and when the finger tab 24 is moved laterally inward with respect to the base plate 12 (downward in the illustrated embodiment), the tang 22 pivots so as to extend at least partially beyond the base plate 12 in a lateral direction.

The base plate 12 preferably includes a detent 28 that is formed on a surface of the base plate 12 adjacent to the body plate 16, and the body plate 16 preferably includes a raised dimple 26 that protrudes outwardly from a surface of the body plate 16 adjacent to the base plate. To help retain the body plate 16 in the first position with respect to the base plate 12, and thus to inhibit unintentional pivoting of the body plate 16 away from the first position, the dimple 26 is aligned with and engages the detent 28 when the body plate 16 is in the first position with respect to the base plate 12. The pivot pin 20 may be configured to bias the body plate 16 and the base plate 12 together, putting the pivot pin 20 in tension. To pivot the body plate 16 out of the first position, sufficient force must be applied to the finger tab 24 to disengage the dimple 26 from the detent 28, and when the body plate 26 is returned to the first position, the dimple 26 snaps back into the detent 28. When the dimple 16 snaps in or out of engagement with the detent, the pivot pin 20, alone or in combination with the body plate 16 itself flexes in a spring like manner to allow the dimple 26 be raised out of the detent 28 and forced back into the detent 28 again.

In one variation, as depicted, the base plate 12 includes a through hole 32, and the body plate 16 includes a through hole 30 that is aligned with the through hole 32 in the base plate 12 when the body plate 16 is in the first position. If desired, a securing device such as a removable pin, safety strap or bolt can be inserted into the aligned through holes 30, 32 to prevent unintentional movement of the body plate 16 out of the first position.

An exemplary operation of securing a rack rail 90 having a locking lever 10 to a rack assembly is shown in the sequence of FIGS. 4A-4D. In the example, a rack assembly includes a first mounting rail 200A having one or more slots 210A and a second mounting rail 200B positioned substantially parallel to and spaced apart from the first mounting rail 200A and having one or more slots 210B. The rack rail 90, including the end insert 96 and the locking lever 10, is longer than the distance between the mounting rails 200A, 200B.

Figure 4A:
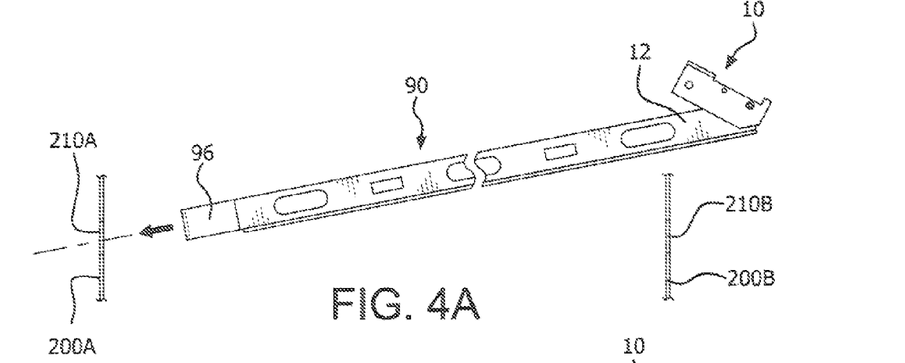
FIG. 4A shows alignment of an end insert at one end with a slot in a mounting rail on one side of a rack assembly, with the locking lever at the other end pivoted to a disengaged position.
Figure 4B:
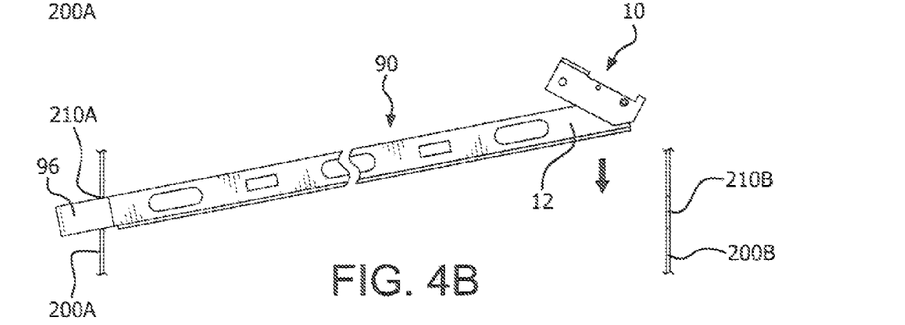
FIG. 4B shows insertion of the end insert into a slot in the mounting rail and pivoting of the rack rail into a perpendicular orientation with respect to the mounting rail.

To install the rack rail 90, as shown in FIG. 4A, the rack rail 90 is oriented at a non-perpendicular angle with respect to the first mounting rail 200A and the end insert 96 is aligned with the slot 210A. As shown in FIG. 413, the end insert 96 is inserted into the slot 210A and the end of the rack rail 90 having the locking lever 10 is pivoted about the slot 210A to orient the rack rail 90 substantially perpendicularly to the first mounting rail 200A. The travel of the end insert 96 into the slot 210A is limited by contact between the end wall 99 of the bottom rail member 94 and the first mounting rail 200A.

Figure 4C:
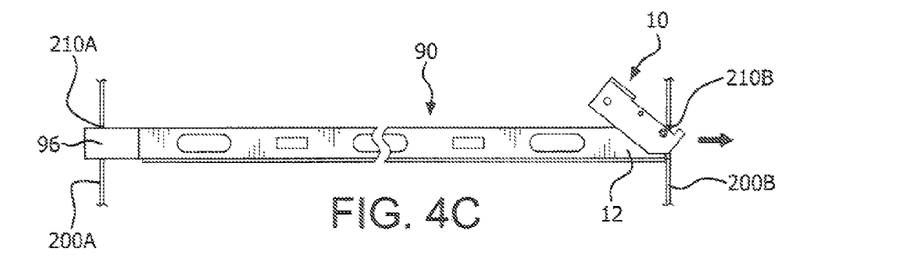
FIG. 4C shows insertion of a portion of the locking lever into a slot in a mounting rail on an opposite side of the rack assembly.

As shown in FIG. 4C, the rack rail 90 is moved toward the second mounting rail 200B with the locking lever 10 in the second position until an end portion of the locking lever 10 is inserted into the slot 210B. With the locking lever 10 in the second position, the tang 22 of the body plate 16 is sufficiently recessed with respect to the base plate 12 that the lateral dimension of the locking lever 10 is less than that of the slot 210B so that a portion of the locking lever 10 including the tang 22 passes through the slot 21013 and is positioned on an opposite side of the mounting rail 200B. The travel of the locking lever 10 into the slot 210B is limited by contact between the end wall 37 of the bottom rail member 94 and the second mounting rail 200B, which prevents the end insert 96 from coming completely out of the slot 210A in the first mounting rail 200A.

Figure 4D:
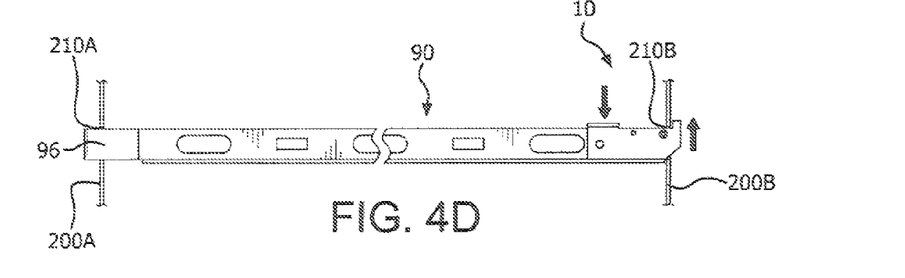
FIG. 4D shows engagement between the locking lever and the mounting rail with the locking lever pivoted to an engaged position.

Finally, as shown in FIG. 4D, the locking lever 10 is pivoted to the first position so that the tang 22 of the body plate 16 extends laterally beyond the base plate 12 and the lateral dimension of the locking lever 10 is greater than that of the slot 210B. As a result, the locking lever 10, and thus the end portion of the rack rail 90 including the locking lever 10, cannot be removed from the slot 210B. And because the end wall 37 of the bottom rail member 94 limits movement of the rack rail 90 toward the mounting rail 200B, the end insert 96 cannot be removed from the slot 210A. Therefore, the rack rail 90 is secured between the mounting rails 200A, 20013 until such time as the locking lever 10 is pivoted to the second position and the end of the rack rail 90 including the locking lever 10 is withdrawn from the slot 21013. A pin (not shown) may be inserted through the apertures 30, 32 to further secure the locking lever 10 in the latched position. It is readily understood that removal of the rack rail 90 from the mounting rails 200A, 200B follows the reverse steps as installation.

Use of the locking lever 10 is not limited to the type of rack rail 90 depicted in FIGS. 1, 2, and 4A-4D. Rather, the locking lever 10 can be used on any rack-mountable component.

Figure 3:
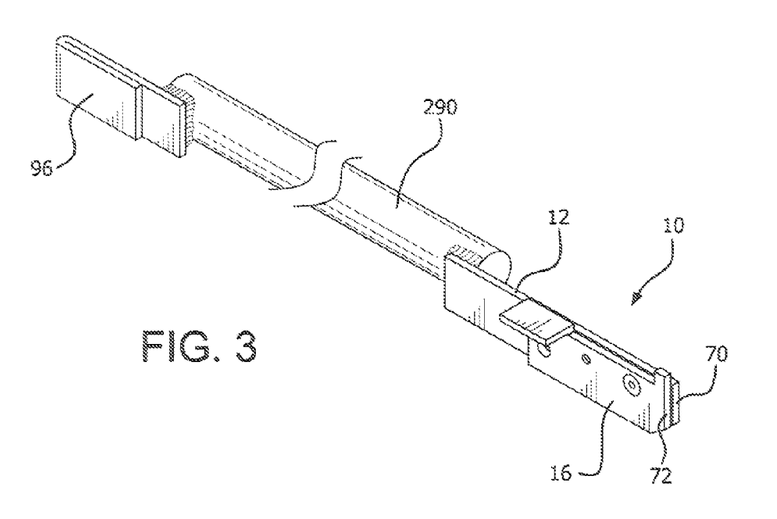
FIG. 3 is a perspective view showing another type of rack rail rack rail including a rack rail lever at one end and an end insert at the other end.

In one example, FIG. 3 shows a locking lever 10 attached to one end of a solid cylindrical rack bar 290, and an end insert 96 attached to the other end of the rack bar 290.

Figure 5A:
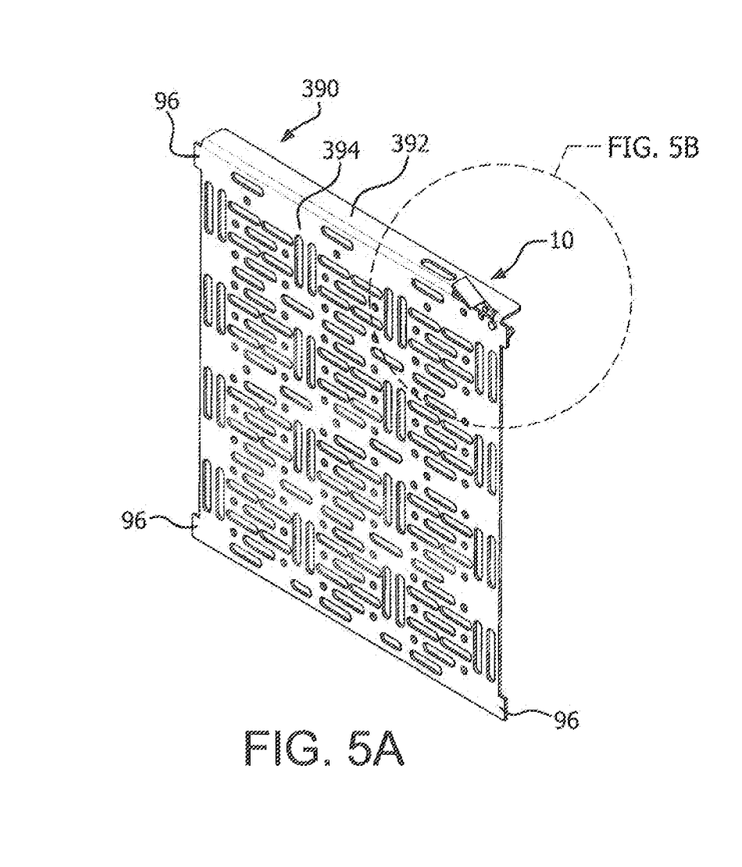
FIG. 5A is a perspective view showing a rack component including a rack rail locking lever.
Figure 5B:
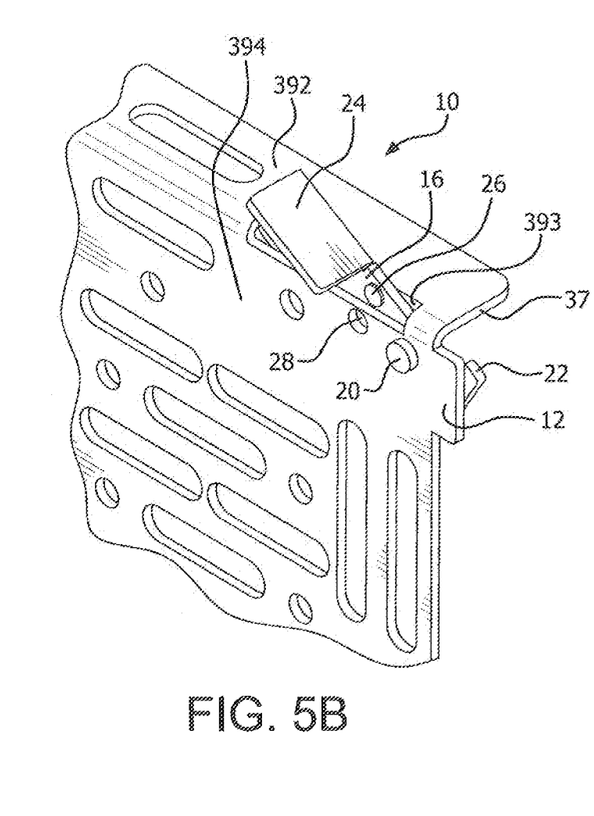
FIG. 5B is a partial expanded perspective view showing the rack rail locking lever of FIG. 5A.

In another example, as shown in FIGS. 5A and 5B a rack tray 390 may be fitted with one or more locking levers 10, in combination with one or more end inserts 96, as shown. The rack tray 390 includes a panel 392, from which the one or more end inserts 96 extend, and a top rail member 294 formed together with the panel 392 at a generally perpendicular angle with respect to the panel 392. As depicted, the locking lever 10 is mounted by a pivot pin 20 to the panel 392 on the same side of the panel from which the rail member 394 extends. The locking lever 10 is accessible for actuation via an opening 393 at the junction of the panel 392 and the rail member 394. In particular, to place the locking lever 10 in a first or latched position, the finger tab 24 is positioned to be generally aligned with the rail member 394, and to place the locking lever 10 in a second or unlatched position, the locking lever 10 is pivoted about the pivot pin 20 so that the finger tab 24 is skewed with respect to the rail member 394.

Figure 6:
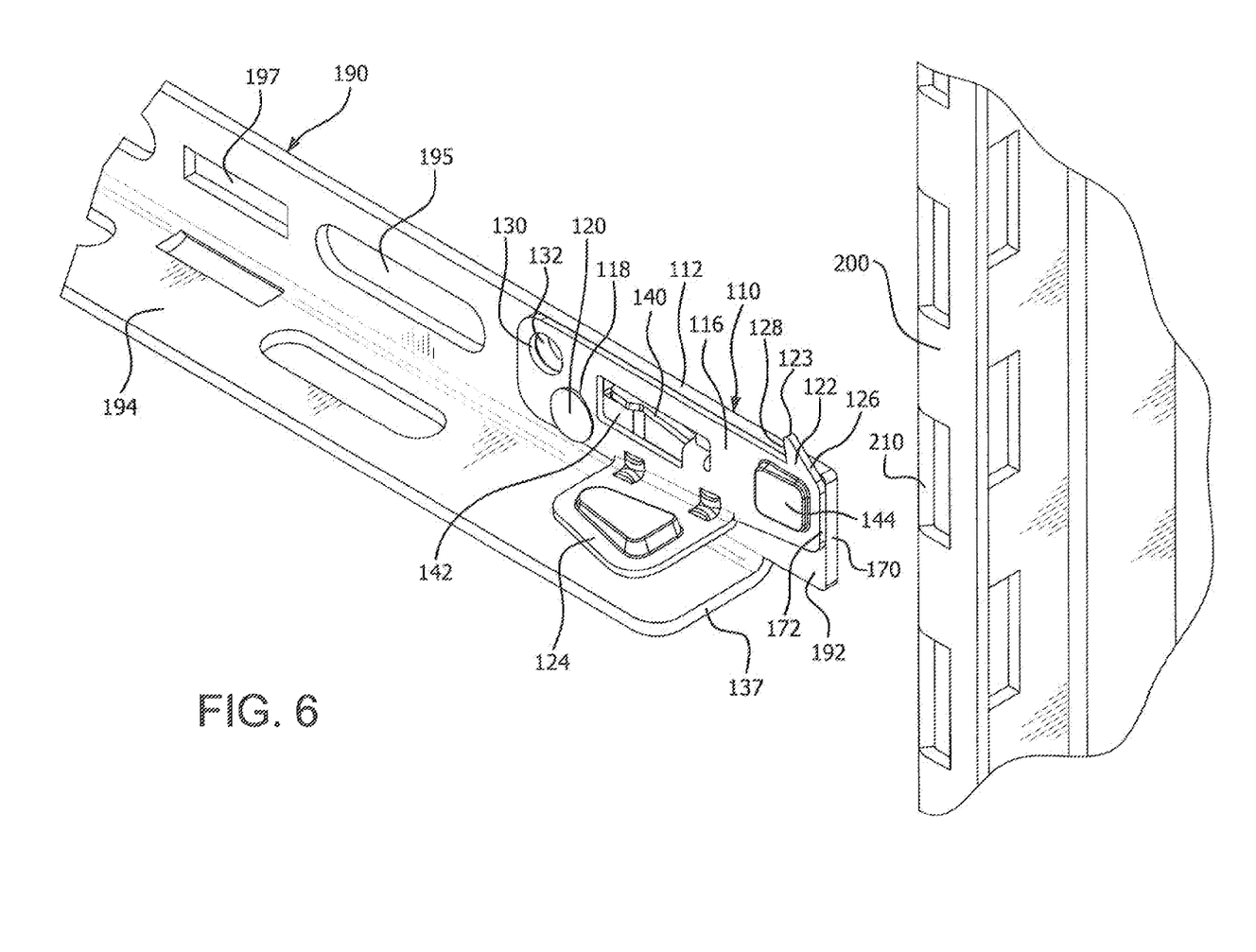
FIG. 6 is a perspective view showing one end of a rack rail including another embodiment of a rack rail locking lever.
Figure 7:
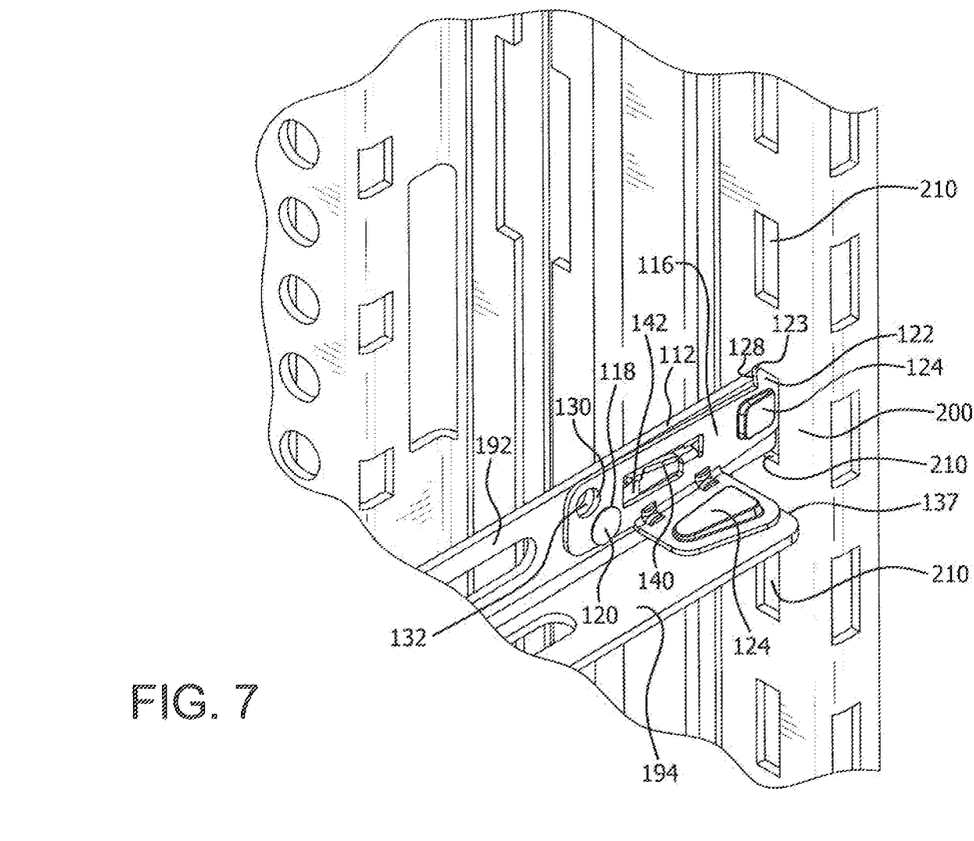
FIG. 7 is a perspective view showing the end of the rack rail of FIG. 6 partially inserted into a slot in a mounting rail of a rack assembly.

Another embodiment of a locking lever 110 is shown in FIGS. 6 and 7 in conjunction with a rack rail 190 similar to the rack rail 90. The rack rail 190 includes a side rail member 192 and a bottom rail member 194 preferably formed together in an angled or L-shaped cross-section. One or both of the side rail member 192 and the bottom rail member 94 may include slots 195, 197 that can be used to mount various components on the rack rail 190. An end insert (not shown) may be formed at one end of the rack rail 190, and the locking lever 110 is positioned at an opposite end of the rack rail 190. However, the locking lever 110 is not limited to such use, and may be used in conjunction with any rack-mountable component.

The locking lever 110 includes a base plate 112, which may be formed integrally with or be a portion of the side rail member 192, or may be rigidly affixed to an end of the side rail member 192. The locking lever 110 further includes a body plate 116 that is pivotably mounted with respect to the base plate 112. In the depicted embodiment, the body plate 116 is connected to the base plate 112 by a pivot pin or rivet 120 that is secured through an aperture 118 in the body plate 116. In the locking lever 110, an end portion of the base plate 112 extends longitudinally beyond an end wall 137 of the bottom rail member 194, and the longitudinally outer ends 170, 172 of the base plate 112 and the body plate 116, respectively, may be substantially aligned.

The body plate 116 includes a tang 122 that extends generally laterally outward in one direction at or near one of the longitudinal ends of the body plate 116, and at a distance from the pivot pin 120. In the depicted embodiment, the tang 122 has a distal tip 123 defined by a front sloped surface 126 and a rear slope surface 128, and is angled so that the tip 123 faces away from the outer end 170 of the body plate 116. The body plate 116 is pivotable about the pivot pin 120 with respect to the base plate 112 between a first position and a second position. The body plate 116 may include a raised tapered portion 144 on a face opposite the base plate 112 such that the width of the end portion of the locking lever 110 is about the same as the width of the slot 210 on the mounting rail 200.

In the first position, the longitudinal direction of the body plate 116 is substantially parallel to the longitudinal direction of the base plate 112. In the first position, the combined lateral dimension (height in the illustrated embodiment) of the locking lever 110, including the base plate 112 and the body plate 116 with the tang 122, is at least slightly larger than the height of a slot 210 in a mounting rail 200.

In the second position, the longitudinal direction of the body plate 116 is pivoted so as to be at an angle (skewed) with respect to the longitudinal direction of the base plate 112, which results in the tang 122 being at least partially retracted in the lateral direction with respect to the base plate 112. Therefore, in the second position, the combined lateral dimension of the locking lever 110, including the base plate 112 and the body plate 116 with the tang 122, is at least slightly smaller than the height of the slot 210.

The locking lever 110 preferably includes a spring 140 to bias the body plate 116 toward the first position with respect to the base plate 112. In the depicted embodiment, the spring 140 is integrally formed with the body plate 116. For example, the spring 140 can be formed from a bent portion of the same flexible but resilient material (e.g., metal or plastic) from which the body plate 116 is made. Preferably, as shown in the embodiment of FIGS. 6 and 7, the spring 140 is bent out of the plane of the body plate 116 and extends generally parallel to the longitudinal direction of the body plate 116. One end of the spring 140 is attached to the body plate 116, and an opposite end of the spring 140 is movable by flexing the spring 140. The opposite end of the spring 140 contacts a spring pad 142 on the base member 112 in such a manner as to exert a spring force as the body plate 116 is pivoted out of the first position toward the second position (i.e., the spring biases the locking lever into the first position.) The spring pad 142 can be integrally formed as part of the base plate 112, or can be attached so as to be immovable with respect to the base plate 112.

To facilitate pivoting of the body plate 116 between the first and second positions with respect to the base plate 112, the body plate 116 may include a finger tab 124. In the depicted embodiment, the finger tab 124 is formed from the same piece of material as the body plate 116 and is bent over at approximately a right angle so as to extend in a direction away from a lower edge of the base plate 112. The finger tab 124 is located on the same side of the body plate 116 as the tang 122 with respect to the pivot pin 120, such that when the finger tab 124 is moved laterally toward the bottom rail member 194, the tang 122 pivots so as to be at least partially recessed in a lateral direction, and when the finger tab 124 is released, the force of the spring 140 causes the finger tab 124 to be pivoted laterally outward away from the bottom rail member 194 with respect to the base plate 112 and the tang 122 extends (protrudes) at least partially beyond the base plate 112 in a lateral direction.

Although a specific embodiment of a spring 140 is depicted in FIGS. 6 and 7, it is contemplated that any spring that biases the body plate 116 from the second position toward the first position could be employed. In particular, the spring 140 can operate in flexure as shown, or can be arranged to operate in compression or tension, depending on the location of the spring 140 with respect to the pivot pin 120 and the tang 122. For example, a spring located between the finger tab 124 and the bottom rail member 194, and located in the same direction from pivot pin 120 as the tang 122, would be in compression; however, a spring attached between the body plate 112 and the bottom rail member 194 or side rail,member 192, and located in the opposite direction from the pivot pin 120 as the tang 122, would be in tension.

As the end portion of the locking lever 110 is inserted into a slot 210, the front sloped surface 126 of the tang 122 contacts an edge of the slot 210, forcing the body plate 116 to pivot toward the second position until the tip 123 passes through the slot, at which point the spring 140 causes the body plate 116 to snap back into the first position. Subsequently, if an attempt is made to remove the end portion of the locking lever 110 from the slot without actuating the body plate 116 by way of the finger tab 124, the tip 123 will contact a rear face the mounting rail 200 but will not allow the locking lever 110 to be pulled out of the slot. The rear sloped surface 118, by being undercut, prevents contact between the tang 122 and the mounting rail 200 from actuating the body plate 116 away from the first position toward the second position.

In one variation, as depicted, the base plate 112 includes a through hole 132, and the body plate 116 includes a through hole 130 that is aligned with the through hole 132 in the base plate 112 when the body plate 116 is in the first position. If desired, a securing device, such as a pin, safety strap or bolt can be inserted into the aligned through holes 130, 132 to prevent unintentional movement of the body plate 116 out of the first position.

Figure 8:
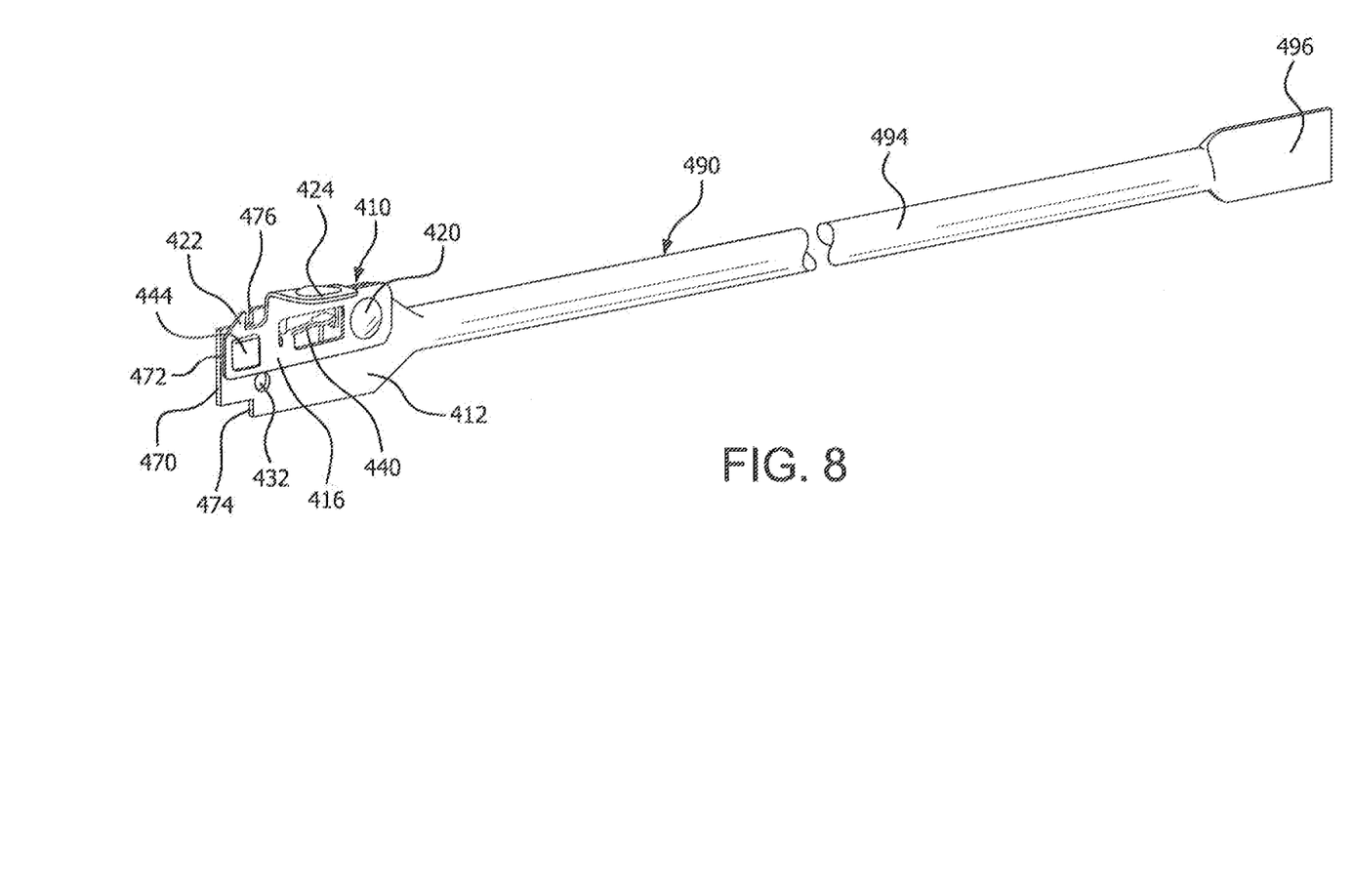
FIG. 8 is a side perspective view showing another type of rack rail including an embodiment of a rack rail locking lever at one end and an end insert at the other end.
Figure 9:
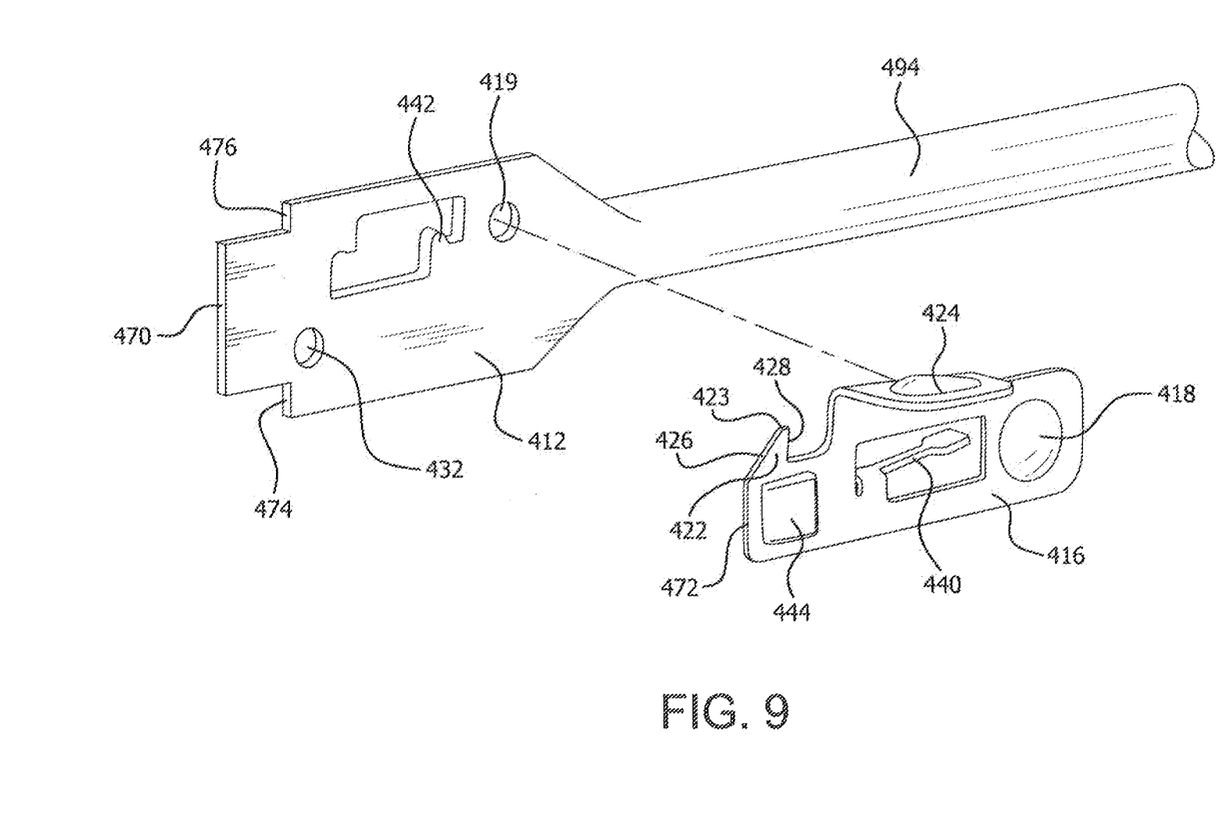
FIG. 9 is an exploded side perspective view of a portion of the rack rail of FIG. 8 showing the rack rail locking lever removed from the one end of the rack rail.
Figure 10:
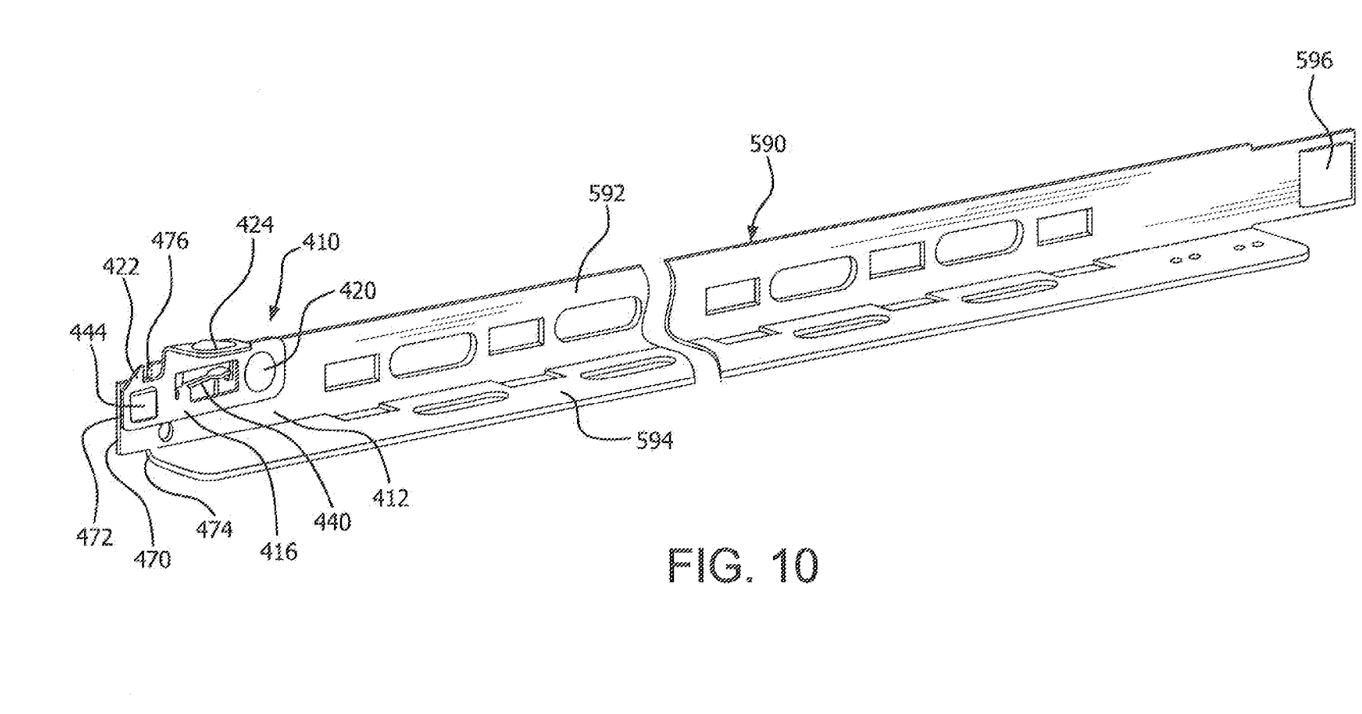
FIG. 10 is a side perspective view showing another type of rack rail including an embodiment of a rack rail locking lever at one end and an end insert at the other end.
Figure 11:
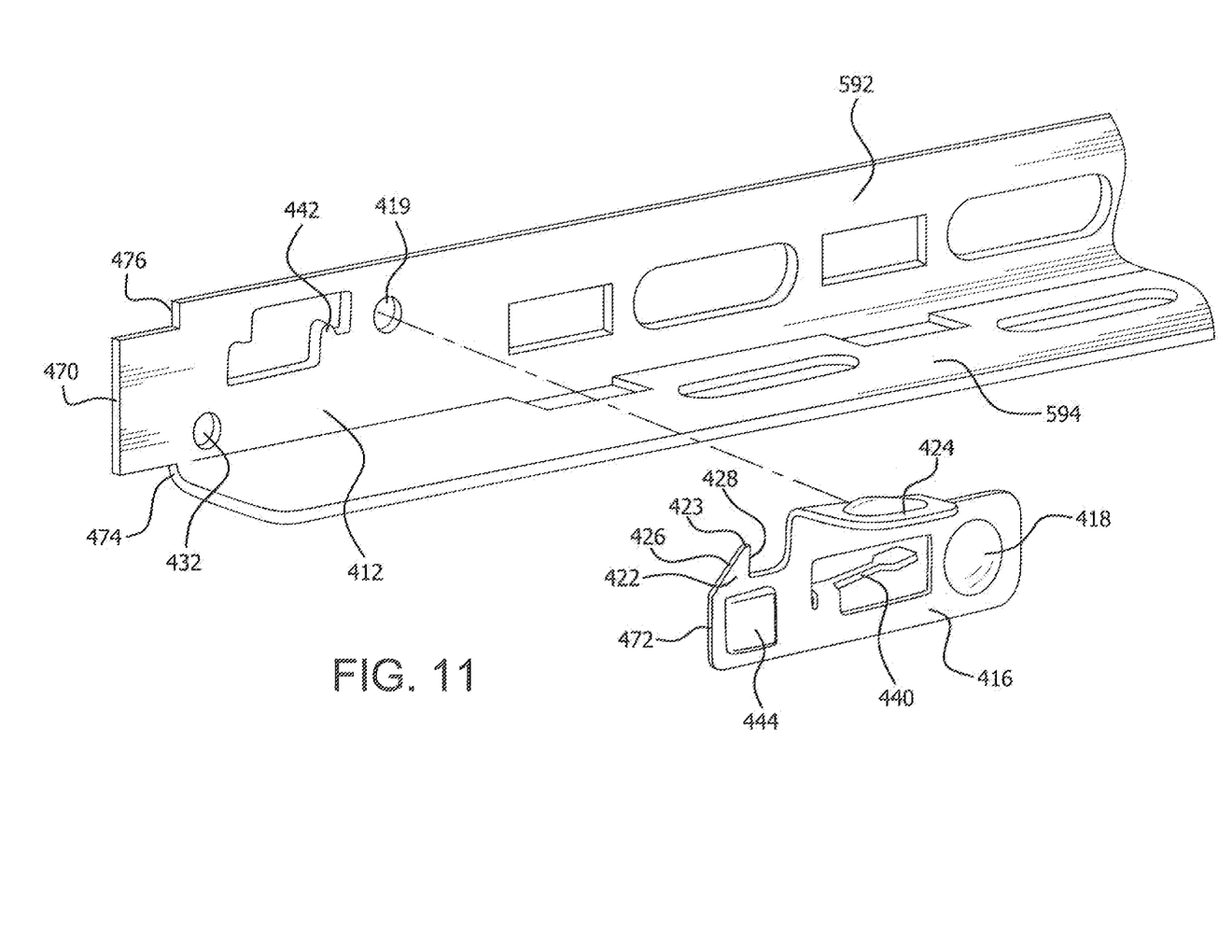
FIG. 11 is an exploded side perspective view of a portion of the rack rail of FIG. 10 showing the rack rail locking lever removed from the one end of the rack rail.

Another embodiment of a locking lever 410 is shown in FIGS. 8 and 9 in conjunction with a solid rack rail 490 similar to the rack rail 290 of FIG. 3, and in FIGS. 10 and 11 in conjunction with a slotted L-shaped rack rail 490 similar to the rack rail 190 of FIGS. 6 and 7. An end insert 492 is formed at one end of the rack rail 490, and the locking lever 410 is located at the other end of the rack rail 490. Similarly, an end insert 592 is formed at one end of the rack rail 590, and the locking lever 410 is located at the other end of the rack rail 590.

The locking lever 410 includes a base plate 412, which may be formed integrally with or be a portion of the rail 490, 590, or may be rigidly affixed to an end of the rail 490, 590 such as by welding or brazing. The locking lever 410 further includes a body plate 416 that is pivotably mounted with respect to the base plate 412. In the depicted embodiment, the body plate 416 is connected to the base plate 412 by a pivot pin or rivet 420 that is secured through an aperture 418 in the body plate 416 and an aperture 419 in the base plate 412. The base plate 412 has a longitudinally outer end 470 and is notched to have recessed end faces 474 and 476 below and above the end 470, respectively. The body plate 416 has an end 472 that may be substantially aligned with the end 470 of the base plate 412.

The body plate 416 includes a tang 422 that extends generally laterally outward in one direction at or near one of the longitudinal ends of the body plate 416, and at a distance from the pivot pin 420. In the depicted embodiment, the tang 422 has a distal tip 423 defined by a front sloped surface 426 and a rear surface 428, and is angled so that the tip 423 faces away from the outer end 470 of the body plate 416. The body plate 416 is pivotable about the pivot pin 420 with respect to the base plate 412 between a first position and a second position. The body plate 416 may include a raised tapered portion 444 on a face opposite the base plate 412 such that the width of the end portion of the locking lever 410 is about the same as the width of a slot 210 on a mounting rail 200.

As shown in the illustrated embodiment, in the first position, the longitudinal direction of the body plate 416 is substantially parallel to the longitudinal direction of the base plate 412. In the first position, the combined lateral dimension (height in the illustrated embodiment) of the locking lever 410, including the base plate 412 and the body plate 416 with the tang 422, is at least slightly larger than the height of a slot 210 in a mounting rail 200.

In the second position, the longitudinal direction (or axis) of the body plate 416 is pivoted so as to be at an angle (skewed) with respect to the longitudinal (vertical) direction of the base plate 412, which results in the tang 422 being at least partially retracted in the lateral direction with respect to the base plate 412. Therefore, in the second position, the combined lateral dimension of the locking lever 410, including the base plate 412 and the body plate 416 with the tang 422, is at least slightly smaller than the height of the slot 210. In particular, the combined height is approximately equal to the height of the end portion of the base plate 412 that terminates in the end 470, bounded by the recessed notches above and below.

As in the embodiment of FIGS. 6 and 7, the locking lever 410 preferably includes a spring 440 to bias the body plate 416 toward the first position with respect to the base plate 412. In the depicted embodiment, the spring 440 is integrally formed with the body plate 416. For example, the spring 440 can be formed from a bent portion of the same flexible but resilient material (e.g., metal or plastic) from which the body plate 416 is made. Preferably, the spring 440 is bent out of the plane of the body plate 416 and extends generally parallel to the longitudinal direction of the body plate 416. One end of the spring 440 is attached to the body plate 416, and an opposite end of the spring 440 is movable by flexing the spring 440. The opposite end of the spring 440 contacts a spring pad 442 on the base member 412 in such a manner as to exert a spring force as the body plate 416 is pivoted out of the first position toward the second position (i.e., the spring biases the locking lever into the first position.) The spring pad 442 can be integrally formed as part of the base plate 412, or can be attached so as to be immovable with respect to the base plate 412.

To install the rack rail 490, 590 into a slot 210 in a mounting rail 200, it is not necessary to manually actuate the locking lever 410 against the spring 440. In particular, as the end portion of the locking lever 410 is inserted into a slot 210, the front sloped surface 426 of the tang 422 contacts an edge of the slot 210, forcing the body plate 416 to pivot toward the second position until the tip 423 passes through the slot, at which point the spring 440 causes the body plate 416 to snap back into the first position. Subsequently, if an attempt is made to remove the end portion of the locking lever 410 from the slot without actuating the body plate 416 against the spring 440, the tip 423 will contact a rear face the mounting rail 200 but will not allow the locking lever 410 to be pulled out of the slot. The rear surface 428 is configured to prevent contact between the tang 422 and the mounting rail 200 from actuating the body plate 416 away from the first position toward the second position.

For removal of the rack rail 490, 590 from a slot 210 in a mounting rail 200, the body plate 416 must be pivoted to the second position with respect to the base plate 412. To facilitate pivoting of the body plate 416 between the first and second positions with respect to the base plate 412, the body plate 416 may include a finger tab 424. In the depicted embodiment, the finger tab 424 is formed from the same piece of material as the body plate 416 and is bent over at approximately a right angle so as to extend in a direction away from an upper edge of the base plate 412. The finger tab 424 is located on the same side of the body plate 416 as the tang 422 with respect to the pivot pin 420, such that when the finger tab 424 is moved laterally downward, the tang 422 pivots so as to be at least partially recessed in a lateral direction, and when the finger tab 424 is released, the force of the spring 440 causes the finger tab 424 to be pivoted laterally upward and the tang 422 extends (protrudes) at least partially beyond the base plate 412 in a lateral direction.

In one variation, as depicted, the base plate 412 includes a through hole 432 located adjacent to an edge of the body plate 416. If desired, a securing device, such as a pin, safety strap or bolt can be inserted into the aligned through hole 432 to prevent unintentional movement of the body plate 416 out of the first position.

While the invention has been disclosed with reference to certain preferred embodiments, numerous modifications, alterations, and changes to the described embodiments are possible without departing from the sphere and scope of the invention, as defined in the appended claims and equivalents thereof. Accordingly, it is intended that the invention not be limited to the described embodiments, but that it have the full scope defined by the language of the following claims.

What is claimed is:

1. A locking lever for a removable rack rail comprising:
a side member;
a base plate affixed to or incorporated into the side member, the base plate having a longitudinal direction and a lateral direction perpendicular to the longitudinal direction;
a longitudinally facing feature that limits a distance of insertion of the base plate into a slot in a mounting rail;
wherein an end portion of the base plate extends beyond the longitudinally facing feature so as to form part of an end portion of the rail locking lever that is adapted to be inserted into the slot in a mounting rail;
a body plate pivotably mounted to the base plate so as to be pivotable about a pivot point between a first position and a second position with respect to the base plate, the body plate having a longitudinal direction that is parallel to the longitudinal direction of the base plate when the body plate is in the first position and a lateral direction perpendicular to the longitudinal direction;
a tang extending in the body plate lateral direction from the body plate; and
a finger tab extending from the body plate for actuating the body plate to pivot about the pivot point with respect to the base plate;
wherein when the body plate is in the first position with respect to the base plate, the tang extends laterally beyond the base plate so that the end portion of the rack rail locking lever has a size in the lateral direction at least slightly larger than the size of the base plate end portion, to tend to prevent removal of the end portion from the slot; and
wherein when the body plate is in the second position with respect to the base plate, the tang is at least partially retracted in the lateral direction with respect to the base plate so that the end portion of the rack rail locking lever has a size in the lateral direction at least slightly smaller than the size when the body plate is in the first position, to tend to facilitate insertion of the end portion into the slot.

2. The locking lever of claim 1, wherein the tang and the finger tab are located on opposite sides of the pivot point.

3. The locking lever of claim 1, wherein the tang and the finger tab are located on the same side of the pivot point.

4. The locking lever of claim 1, the body plate further comprising a raised dimple on a face adjacent to the base plate, and the base plate further comprising a detent on a face adjacent to the body plate;
wherein when the body plate is in the first position, the dimple is engaged with the detent to inhibit movement of the body plate out of the first position.

5. The locking lever of claim 1, further comprising:
a spring biasing the body plate toward the first position with respect to the base plate when the body plate is in the second position.

6. A locking lever, for a removable rack rail comprising:
a side member;
a base plate affixed to or incorporated into the side member, the base plate having a longitudinal direction and a lateral direction perpendicular to the longitudinal direction;
a body plate pivotably mounted to the base plate so as to be pivotable about a pivot point between a first position and a second position with respect to the base plate, the body plate having a longitudinal direction that is parallel to the longitudinal direction of the base plate when the body plate is in the first position and a lateral direction perpendicular to the longitudinal direction;
a tang extending in the body plate lateral direction from the body plate;
a finger tab extending from the body plate for actuating the body plate to pivot about the pivot point with respect to the base plate; and
a spring biasing the body plate toward the first position with respect to the base plate when the body plate is in the second position, wherein the spring is a flexible member integral at one end with the body plate, positioned to flex along its length, and having an opposite free end engaging the base plate;
wherein when the body plate is in the first position with respect to the base plate, the tang extends laterally beyond an end portion of the base plate so that an end portion of the rack rail locking lever has a size in the lateral direction at least slightly larger than the size of the base plate end portion; and
wherein when the body plate is in the second position with respect to the base plate, the tang is at least partially retracted in the lateral direction with respect to the base plate so that the end portion of the rack rail locking lever has a size in the lateral direction at least slightly smaller than the size when the body plate is in the first position.

7. The locking lever of claim 5, wherein the spring is positioned to operate in compression.

8. The locking lever of claim 5, wherein the spring is positioned to operate in tension.

9. The locking lever of claim 5, wherein the tang includes a sloped front surface such that when the end portion of the locking lever is inserted into the slot on the mounting rail, the sloped front surface of the tang is adapted to contact the mounting rail adjacent to the slot, thereby causing the body plate to pivot to the second position with respect to the base plate and allowing the end portion of the locking lever to be inserted into the slot.

10. The locking lever of claim 5, wherein the spring is a flexible metal member affixed at one end to the body plate and having an opposite free end engaging the base plate.

11. The locking lever of claim 1, the base plate further comprising a through hole, and the body plate further comprising a through hole that is aligned with the through hole in the base plate when the body plate is in the first position, such that a securing device can be inserted into the through holes to prevent movement of the body plate out of the first position.

12. The locking lever of claim 1, the body plate further comprising a raised portion on a face opposite the base plate such that a width of the end portion of the locking lever is increased.

13. A rack component for mounting in a rack, comprising a locking lever as in claim 1.

14. A rack rail for mounting in a rack, comprising a locking lever as in claim 1.

15. A locking lever comprising:
a side member;
a base plate affixed to or incorporated into the side member, the base plate having a longitudinal direction and a lateral direction perpendicular to the longitudinal direction;
a longitudinally facing surface fixed in relation to the side member;
wherein an end portion of the base plate extends beyond the longitudinally facing surface so as to form part of an end portion of the rail locking lever;

a body plate mounted to the base plate so as to be pivotable about a pivot point between a first position and a second position with respect to the base plate, the body plate having a longitudinal direction that is parallel to the longitudinal direction of the base plate when the body plate is in the first position and a lateral direction perpendicular to the longitudinal direction;

a tang extending in the lateral direction of the body plate from the body plate; and a finger tab extending from the body plate for actuating the body plate to pivot about the pivot point with respect to the base plate;

wherein when the body plate is in the first position with respect to the base plate, the tang extends laterally beyond the base plate so that the end portion of the rail locking lever has a size in the lateral direction at least slightly larger than the size of the base plate end portion;

wherein when the body plate is in the second position with respect to the base plate, the tang is at least partially retracted in the lateral direction with respect to the base plate so that an end portion of the locking lever has a size in the lateral direction at least slightly smaller than the size when the body plate is in the first position;

wherein the tang and the finger tab are located on opposite sides of the pivot point; and wherein the body plate includes a raised dimple on a face adjacent to the base plate and the base plate further includes a detent on a face adjacent to the body plate, such that when the body plate is in the first position, the dimple is engaged with the detent to inhibit movement of the body plate out of the first position.

16. A locking lever comprising:

a side member;

a base plate affixed to or incorporated into the side member, the base plate having a longitudinal direction and a lateral direction perpendicular to the longitudinal direction;

a longitudinally facing surface fixed in relation to the side member and forming an end stop;

wherein an end portion of the base plate extends beyond the longitudinally facing surface so as to form part of an end portion of the rail locking lever;

a body plate mounted to the base plate so as to be pivotable about a pivot point between a first position and a second position with respect to the base plate, the body plate having a longitudinal direction that is parallel to the longitudinal direction of the base plate when the body plate is in the first position and a lateral direction perpendicular to the longitudinal direction;

a tang extending in the lateral direction of the body plate from the body plate;

a spring biasing the body plate toward the first position with respect to the base plate when the body plate is in the second position; and a finger tab extending from the body plate for actuating the body plate to pivot about the pivot point with respect to the base plate;

wherein when the body plate is in the first position with respect to the base plate, the tang extends laterally beyond the end portion of the base plate so that the end portion of the rail locking lever has a first size in the lateral direction at least slightly larger than the size of the base plate end portion;

wherein when the body plate is in the second position with respect to the base plate, the tang is at least partially retracted in the lateral direction with respect to a lateral edge of the base plate so that an end portion of the locking lever has a second size in the lateral direction at least slightly smaller than in the first position;

wherein the tang and the finger tab are located on the same side of the pivot point; and wherein the tang includes a sloped front surface such that when the end portion of the locking lever is inserted into a slot on a mounting rail that is smaller than the first size but larger than the second size, the sloped front surface of the tang is adapted to contact the mounting rail adjacent to the slot, thereby causing the body plate to pivot to the second position with respect to the base plate and allowing the end portion of the locking lever to be inserted into the slot.

17. A locking lever comprising:

a side member;

a base plate affixed to or incorporated into the side member;

a longitudinally facing surface fixed in relation to the side member and forming a feature to limit a distance of insertion of the end portion into a slot;

wherein an end portion of the base plate extends beyond the longitudinally facing surface so as to form part of an end portion of the rail locking lever;

a body plate mounted to the base plate so as to be pivotable about a pivot point between a first position and a second position with respect to the base plate;

a tang protruding from the body plate;

a spring biasing the body plate toward the first position with respect to the base plate when the body plate is in the second position; and a finger tab extending from the body plate for actuating the body plate to pivot about the pivot point with respect to the base plate;

wherein when the body plate is in the first position with respect to the base plate, the tang extends beyond the base plate distally of the longitudinally facing surface so that the end portion of the rail locking lever has a size at least slightly larger than the size of the end portion of the base plate;

wherein when the body plate is in the second position with respect to the base plate, the tang is at least partially retracted with respect to the base plate so that an end portion of the locking lever has a size at least slightly smaller than the size of the end portion of the locking lever in the first position;

wherein the tang and the finger tab are located on the same side of the pivot point; and wherein the tang includes a sloped front surface such that when the end portion of the locking lever is inserted into a slot on a mounting rail, the sloped front surface of the tang is adapted to contact the mounting rail adjacent to the slot, thereby causing the body plate to pivot to the second position with respect to the base plate and tending to facilitate insertion of the end portion of the locking lever into the slot.

18. The rack rail of claim 14, wherein the base plate is integral with the side member, and the rack rail further comprising a bottom member extending in the longitudinal direction of the base plate and forming with the side member an L-shaped cross section.

19. A mounting rack comprising a rack rail as in claim 14 and a mounting rail having a slot, wherein when the body plate is in the first position with respect to the base plate and the tang extends laterally beyond the base plate, the end portion of the rail locking lever has a size in the lateral direction at least slightly larger than a length of the slot, to prevent removal of the end portion from the slot; and wherein when the body plate is in the second position with respect to the base plate and the tang is at least partially retracted in the lateral direction with respect to the base plate, the end portion of the rack rail locking lever has a size in the lateral direction at least slightly smaller than the length of the slot, to enable insertion of the end portion into the slot.

* * * * *